US005469452A

United States Patent [19]
Zehavi

[11] Patent Number: 5,469,452
[45] Date of Patent: Nov. 21, 1995

[54] VITERBI DECODER BIT EFFICIENT CHAINBACK MEMORY METHOD AND DECODER INCORPORATING SAME

[75] Inventor: Ephraim Zehavi, Haifa, Israel

[73] Assignee: Qualcomm Incorporated, San Diego, Calif.

[21] Appl. No.: 767,167

[22] Filed: Sep. 27, 1991

[51] Int. Cl.$^6$ .................................................. G06F 11/10
[52] U.S. Cl. ............................................................ 371/43
[58] Field of Search ............................. 371/43, 44, 45, 371/37.1

[56] References Cited

U.S. PATENT DOCUMENTS

| | | | |
|---|---|---|---|
| 3,789,360 | 1/1974 | Clark, Jr. et al. | 340/146 |
| 4,446,101 | 7/1984 | Yasuda et al. | 371/43 |
| 4,447,908 | 5/1981 | Chevillat et al. | 375/42 |
| 4,777,636 | 10/1988 | Yamashita et al. | 371/43 |
| 4,807,253 | 2/1989 | Hugenavi et al. | 371/43 |
| 4,882,733 | 11/1989 | Tanner | 371/43 |
| 5,113,400 | 5/1992 | Gould et al. | 371/43 |
| 5,233,630 | 8/1993 | Wolf | 371/43 |

OTHER PUBLICATIONS

"Practical Applications of TCM", Houtan Dehesh et al., 1990 IEEE Military Communications Conference, Sep. 30–Oct. 3, 1990.

"Trellis–Coded MPSK Modulation for Highly Efficient Military Satellite Applications", by Andrew J. Viterbi et al., 1988 Military Communications Conference, Oct. 23–26, 1988.

"A Pragmatic Approach to Trellis–Coded Modulation" by Andrew J. Viterbi et al., Jul. 1989–IEEE Communications Magazine, pp. 11–19.

"A 25 MHz Viterbi FEC Code" by Richard Kerr et al. 1990 IEEE Custom Integrated Circuit Conference Proceedings, May 13–16, 1990, pp. 13.6.1–13.6.5.

Primary Examiner—Robert W. Beausoliel, Jr.
Assistant Examiner—Joseph E. Palys
Attorney, Agent, or Firm—Russell B. Miller; Sean English

[57] ABSTRACT

A decoder for decoding trellis coded data in which the received signal is assigned a sector value corresponding to the phase of the signal in accordance with a predetermined signal space sectorization format. A Viterbi decoder is used to reconstruct from the received signal an estimate of a data bit that was coded for transmission. This estimate is re-encoded and provided to a trellis output mapper along with the sector value. The trellis mapper in response to the input re-encoded estimate and sector value provides an estimate of an an uncoded data bit transmitted with the coded data bit.

24 Claims, 4 Drawing Sheets

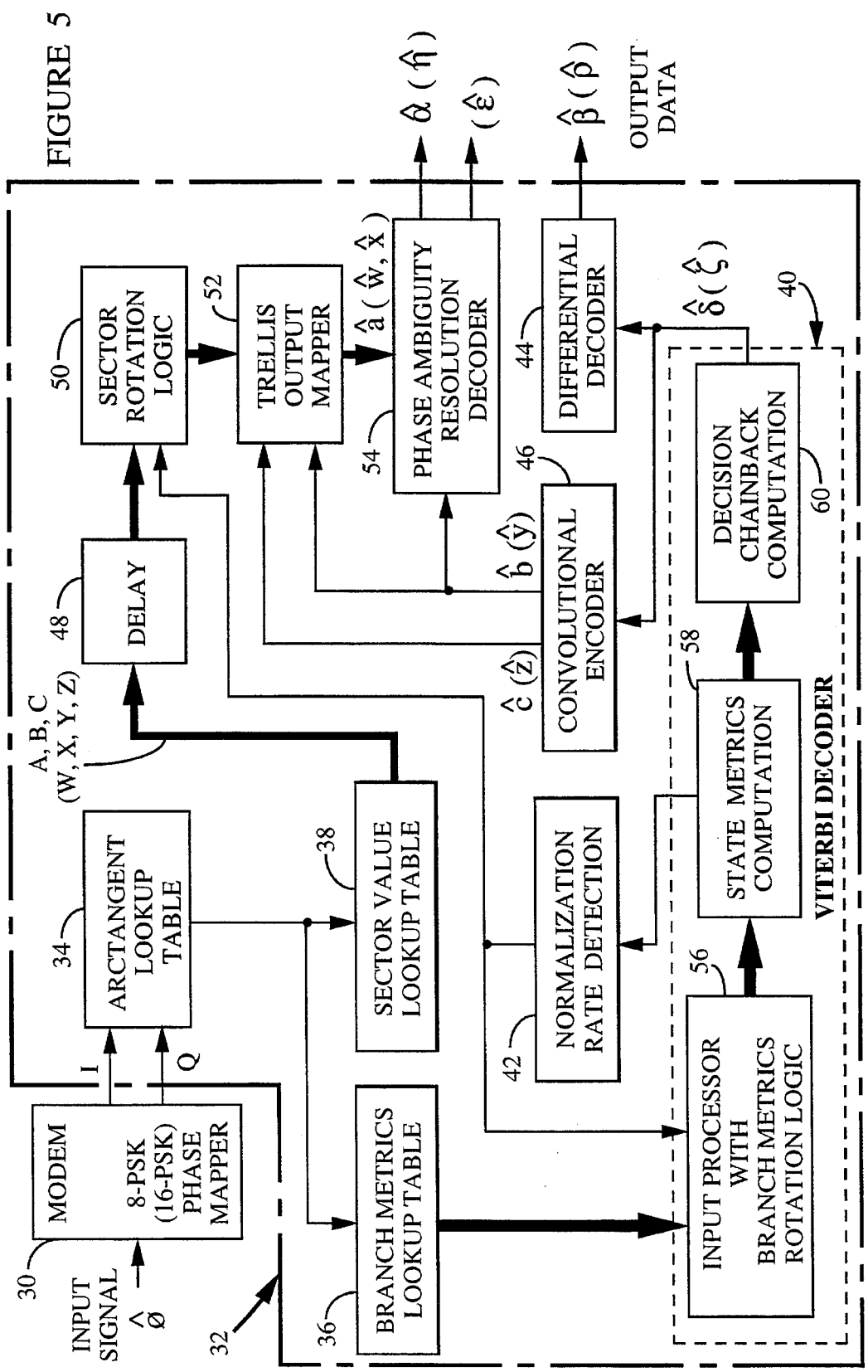

VITERBI DECODER BIT EFFICIENT CHAINBACK MEMORY METHOD AND DECODER INCORPORATING SAME

BACKGROUND OF THE INVENTION

I. Field of the Invention

The present invention relates to communications. More particularly, the present invention relates to a novel and improved method and apparatus for decoding trellis coded modulated data.

II. Description of the Related Art

The field of data communications is concerned with raising the data throughput of a transmission system with a limited signal to noise ratio (SNR). The use of error correcting circuitry such as the Viterbi decoder allows system tradeoffs to be made with smaller SNRs or higher data rates to be used with the same bit error rate (BER). The decrease in the SNR needed is generally referred to as coding gain. Coding gain may be determined from simulated bit error performance curves. In a graph of simulated bit error performance curves the BER of uncoded and various code rate data is charted against $E_b/N_o$, where $E_b$ is the energy per bit and $N_o$ is the one sided spectral density of the Gaussian White Noise. The coding gain at any point along a bit error performance curve for a particular BER level is determined by subtracting the coded $E_b/N_o$ from the uncoded $E_b/N_o$. In the paper "Viterbi Decoding for Satellite and Space Communication", by J. A. Heller and I. M. Jacobs, IEEE Transactions on Communication Technology, Vol. COM-19, pgs. 835–848, October 1971, extensive results of simulations on various decoder apparatus were reported.

The coding rate and the generating polynomials are used to define the convolutional code while the coding rate and constraint length are used to define the Viterbi decoder. The coding rate (k/n) corresponds to the number of coding symbols produced (n) for a given number of input bits (k). The coding rate of ½ has become one of the most popular rates, although other code rates are also generally used. One class of codes with k≠1 are called punctured codes and are produced by discarding or erasing symbols from the rate 1/n code. The constraint length (K) is the length of the shift register used in the convolutional encoding of the data. A constraint length of K=7 is typical in convolutional coding schemes. The convolutional encoder can be thought of as an Finite Impulse Response (FIR) filter with binary coefficients and length K−1. This filter produces a symbol stream with $2^{K-1}$ possible states.

The basic principle of the Viterbi algorithm is to take a convolutional encoded data stream that has been transmitted over a noisy channel and use a finite state machine to efficiently determine the most likely sequence that was transmitted. The Viterbi algorithm is a computationally efficient method of updating the conditional probabilities of the best state and the most probable bit sequence transmitted from the possible $2^{K-1}$ states. In order to compute this probability, all $2^{K-1}$ states for each bit must be computed. The resulting decision from each of these computations is stored as a single bit in a path memory.

A chainback operation, an inverse of the encoding operation, is performed in which the $2^{K-1}$ decision bits are used to select an output bit. After many branches the most probable path will be selected with a high degree of certainty. The path memory depth must be sufficiently long to be governed by the signal-to-noise ratio and not the length of the chainback memory. For a rate ½ code, an exemplary path memory depth is about (5·K), or 35 branches K=7. For a rate ⅞ punctured code the optimal depth increases to 96 branches.

Constraint lengths of K less than 5 are too small to provide any substantial coding gain, while systems with K greater than 7 are typically too complex to implement as a parallel architecture on a single VLSI device. As the constraint length increases, the number of interconnections in a fully parallel computation section increases as a function of $(2^{K-1}\cdot L)$, where L is the number of bits of precision in the state metric computations. Therefore, where K is greater than 7, serial computation devices are generally used which employ large external random access memories (RAMs).

In the paper "Channel Coding with Multilevel/Phase Signal" by G. Ungerboeck, IEEE Transactions on Information Theory, Vol. IT-28, pgs. 55–67, January 1982, a trellis coded modulation (TCM) was described. Ungerboeck showed that within a given spectral bandwidth, it is possible to achieve an Asymptotic Coding Gain of up to 6 dB by employing a rate (n−1)/n convolutional code and doubling the signal set. Unfortunately for each modulation technique and for each bit rate, the maximal coding again is achieved by a different convolutional code. Further disclosed were the results of a search for all convolutional codes for several rates and modulation techniques, and the best codes presented.

In the paper "A Pragmatic Approach to Trellis-Coded Modulation" by A. J. Viterbi, J. K. Wolf, E. Zehavi and R. Padovani, IEEE Communications Magazine, pgs. 11–19, July 1989, a pragmatic approach to trellis coded modulation (PTCM) was disclosed. The underlying concept therein is that a somewhat lower coding gain is achievable by a PTCM based on the "industry standard" rate ½, K=7 convolutional code. Although a lower coding gain is realized, it is very close to the coding gain of Ungerboeck at BERs of interest.

A form of trellis coding has previously been implemented in systems employing Quadratrue Amplitude Modulation (QAM). Using QAM modulation techniques both amplitude and phase are used to represent the data contained within the signal. QAM systems, typically 8-QAM and 16-QAM, are commonly used in applications such as wireline communications where channel interference is minimized such that signal amplitude is substantially uneffected. In these applications the signal amplitude can reliably be used in the data representation. However in other applications, such as the satellite communication environment, it is preferred to transmit modulated data at a high signal power, and thus amplitude, to overcome channel interference. In the satellite communication channel the varying of signal amplitude, as required in the QAM technique, results in a greater data error rate.

In order to provide reliable data transmission in the satellite communication channel it is preferred that signal power be held at a constant high power level. In order to achieve this objective, data is transmitted in a PSK modulation scheme with the data contained within the phase of the transmitted signal. It is further desired that a reliable error correction encoding scheme be employed so as to minimize channel error upon the data. It is further desired that such a coding scheme not significantly increase the number of symbols representative of the information bits while still providing an error correction capability. Accordingly, trellis coding meets each of these desires for the encoding of data for transmission, particularly in the satellite channel or other environments in which channel noise can significantly affect the transmitted signal.

Trellis coding is an attractive coding technique since it possesses an aspect which other coding techniques lack. The power of trellis coding lies in the fact that even though no apparent coding operation is performed on any other bit than the least significant bit of the input data, the decoder is able to provide error correction on all bits. Generally the use of TCM techniques to achieve efficient use of power-bandwidth resources has been limited to low speed applications in digital signal processor implementations. The use of PTCM techniques enable VLSI implementations of an encoder/decoder capable of operating at high rates. A decoder using PTCM techniques is capable of handling different modulation techniques, such as M-ary phase-shift keying (M-ary PSK) including Binary PSK (BPSK), Quadrature PSK (QPSK), 8-PSK, and 16-PSK.

It is well known that as the order of M increases in M-ary modulation, more information can be communicated by the increased number of phase points available. However as more points are made available, the possibility increases that noise will more easily shift the points as received. Trellis coding can be characterized as the marriage of coding and modulation so as to provide a higher reliability/higher performance coding technique over comparable convolutional codes for the higher order M-ary modulation.

For example, a rate 2/3 convolutional code has a Hamming metric tuned to BPSK and QPSK modulation. A comparable rate 2/3 trellis code is one in which one bit is encoded at rate 1/2 while the other bit remains uncoded. A properly chosen rate 2/3 trellis code, in general, performs better than the best rate 2/3 convolutional code for 8-PSK modulation.

In implementing an Ungerboeck type trellis code, a decoder of the Viterbi algorithm type can experience parallel branches in the decoding of the coded data. For example a rate 2/3 code infers that four branches come out of each state. Since the rate 2/3 trellis code uses a rate 1/2 code and an uncoded bit, there are two pairs of parallel branches from the one state. As suggested by Ungerboeck, careful selection of the particular code can eliminate a parallel branch problem. However the implementation of a decoder for codes as suggested by Ungerboeck is quite complex and requires a significant amount of circuitry. Such a design is therefore not conducive to a VLSI implementation where other circuit considerations such as power and size can limit the amount of circuitry in the design of preference.

Using the pragmatic trellis code, whose performance nearly achieves that of the Ungerboeck codes, the parallel branches are present in a Viterbi algorithm decoding of the coded data. As a result, the selection of the correct parallel path within a Viterbi decoder itself can require complex circuitry. When a VLSI implementation is desired the additional circuitry required again raises circuit limiting issues.

It is therefore an object of the present invention to provide a novel and improved method and apparatus for the decoding of trellis encoded data.

Its is another object of the present invention to provide a trellis decoder of minimum circuitry for pragmatic trellis codes.

It is yet another object of the present invention to provide in a trellis decoder a novel and improved method and circuitry for resolving certain phase ambiguities in the received coded data caused by channel impairments.

SUMMARY OF THE INVENTION

The present invention is a novel and improved method and apparatus for the decoding of the trellis coded data transmitted in a M-ary modulation scheme. In the decoder of the present invention a Viterbi decoder along with ancillary circuitry may be used to eliminate parallel branch problems associated with the decoding of data encoded by certain trellis codes in higher order M-ary modulation schemes.

In accordance with the present invention a trellis decoder is devised for decoding trellis coded data for M-ary modulation schemes such as 8-PSK and 16-PSK. In the encoder for 8-PSK modulation one of two input data bits (one of three input data bits for 16-PSK modulation) is differential encoded and then convolutional encoded to produce two encoded symbols. The other input data bit (the other two data bits for 16-PSK modulation) are not error correction encoded. The uncoded bit (the two uncoded bits for 16-PSK modulation) and the two coded symbols respectively form the most significant bit (or bits for 16-PSK modulation) and the two least significant bits of a three-bit phase point value (a four-bit value for 16-PSK modulation). The phase point value corresponds to one of eight different carrier phases (sixteen different carrier phases for 16-PSK modulation) for transmission purposes.

At the trellis decoder the received signal is converted to corresponding branch metric values which are provided to a Viterbi decoder. From the branch metrics the Viterbi decoder generates an estimate of the differential encoded input data bit. The estimate of the differential encoded input data bit is then differential decoded to provide an estimate of the original one input data bit.

Further at the trellis decoder, the received signal is determined to fall within one of eight sectors of the signal space (sixteen sectors for 16-PSK modulation). The sector in which the received signal falls is used in assigning a sector value for the signal. The sector value is provided to a trellis output mapper. The output of the Viterbi decoder is re-encoded by a convolutional encoder to produce two bits which are also provided to the trellis output mapper. The trellis output mapper uses the re-encoded estimates in order to reconstruct the most significant bit of the originally transmitted signal (two most significant bits for 16-PSK modulation), a bit(s) which corresponds to the uncoded input data bit(s). The corrected uncoded input data bit(s) is output from the trellis output mapper so as to provide a two (three) bit output which are estimates of the original input data bits. The present invention further incorporates a technique for decoding data at phases at which the Viterbi decoder produces erroneous data. In this implementation a detection of a high normalization rate is used to shift the branch metrics, and sector value, to an adjacent sector corresponding to a phase at which the Viterbi decoder is capable of recovering the data.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIG. 5 is a block diagram of an exemplary embodiment of the decoder of the present invention for 8-PSK and 16-PSK trellis coded data;

DETAILED DESCRIPTION OF THE PREFERRED EMBODIMENTS

Convolutional encoding of data combined with a Viterbi decoder is a well known technique for providing error correction coding/decoding of data. As mentioned previously, although trellis coding provides a coding operation on only the least significant bit of the input data, the decoder is able to provide error correction on all bits. Therefore, trellis coding provides an advancement over convolutional coding of the input data alone in that all bits need not be coded in order to achieve error correction on all of the data bits.

Figure 1:
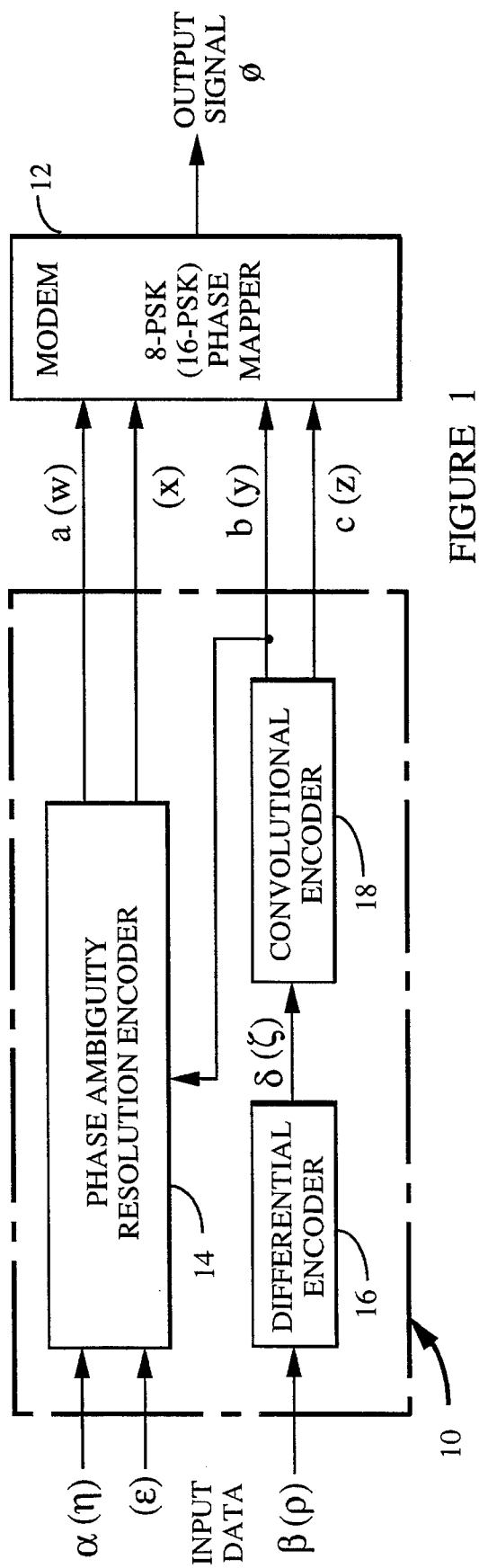
FIG. 1 is a block diagram of an exemplary embodiment of a trellis encoder for 8-PSK and 16-PSK modulation.

Although the present invention is directed to a trellis decoder, it is necessary to understand the nature of trellis encoded data and M-ary modulation thereof. In that respect FIG. 1 illustrates in block diagram form an exemplary trellis coded modulation (TCM) encoder 10 configured for 8-PSK modulation where no phase reference is provided. Encoder 10 receives two bits of input data ($\alpha$, $\beta$) and generates a corresponding three-bit phase point value (a, b, c).

Figure 2:
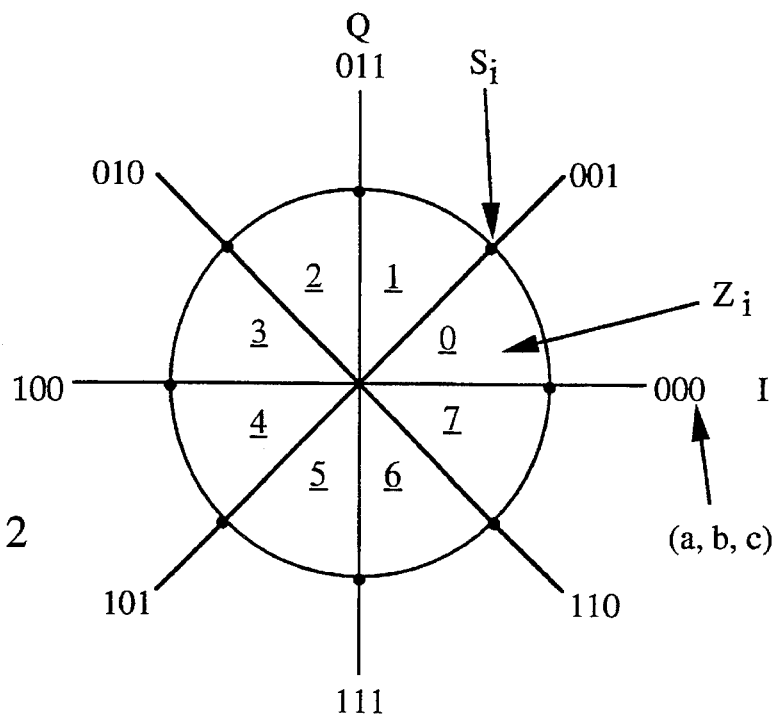
FIG. 2 is a graph illustrating the signal space for 8-PSK modulation.

The phase point value is output from encoder 10 to an 8-PSK phase mapper or modem 12 where the phase of a carrier signal is shifted in accordance with the data sector mapping scheme of FIG. 2. The output of modem 12 is the phase shifted carrier signal ($\phi$) where:

$$\phi = A \cos (2\pi f_c t + \theta). \quad (1)$$

where:

A is the signal amplitude (typically a constant), $f_c$ is the carrier frequency, and $\theta$ is the phase offset corresponding to the sector value, and where:

$$\theta = (a \cdot 180°) + (b \cdot 90°) + ((b-c)^2 \cdot 45°). \quad (2)$$

Modem 12 may be configured as a conventional phase shift keyed (PSK) digital transmission modem using phase shift techniques well known in the art. For example modem 12 is typically configured to transmit the carrier signal in the form according to equation (1). Using the well known trigonometry formula:

$$\cos (x+y) = (\cos x \cdot \cos y) - (\sin x \cdot \sin y), \quad (3)$$

a QPSK modem structure may be implemented using an I and Q constellation corresponding to FIG. 2 to represent the carrier phase shift where:

$$I = A \cos \theta, \text{ and} \quad (4)$$

$$Q = A (-\sin \theta). \quad (5)$$

The I component is mixed directly with the carrier (cos $2\pi$ $f_c t$) in a first mixer while the Q component is mixed with a 90° phase shifted carrier (sin $2\pi$ $f_c t$) in a second mixer. The result of each signal mixing is summed in a summer to produce the signal $\phi$ where:

$$\phi A \cos (2\pi f_c t + \theta) = A ((\cos \theta \cdot \cos 2\pi f_c t) - (\sin \theta \cdot \sin 2\pi f_c t)) \quad (6)$$

or $$\phi = A \cos (2\pi f_c t + \theta) = A ((I \cdot \cos 2\pi f_c t) + (Q \cdot \sin 2\pi f_c t)). \quad (7)$$

Modem 12 may also be configured to include circuitry for converting the baseband signal to RF frequencies, RF transmission circuitry and an antenna system as is well known in the art.

Encoder 10 in an exemplary form is comprised of phase ambiguity resolution encoder circuit 14, differential encoder 16 and convolutional encoder 18. Encoder 10 is preferably of a VLSI construction with the elements thereof individually of conventional design. Data is input to encoder 10 two bits at a time, bits ($\alpha$, $\beta$), with bit $\alpha$ input to circuit 14, and bit $\beta$ input to differential encoder 16.

In each two-bit input of data, bits ($\alpha$, $\beta$), the bit $\beta$ is input to differential encoder 16 where it is differentially encoded. Techniques for the differential encoding of bit $\beta$, along with circuit designs for differential encoders are well known in the art. Each differentially encoded bit or symbol ($\delta$) corresponding to an input bit $\beta$ is output from differential encoder 16 as an input to convolutional encoder 18.

Figure 4:
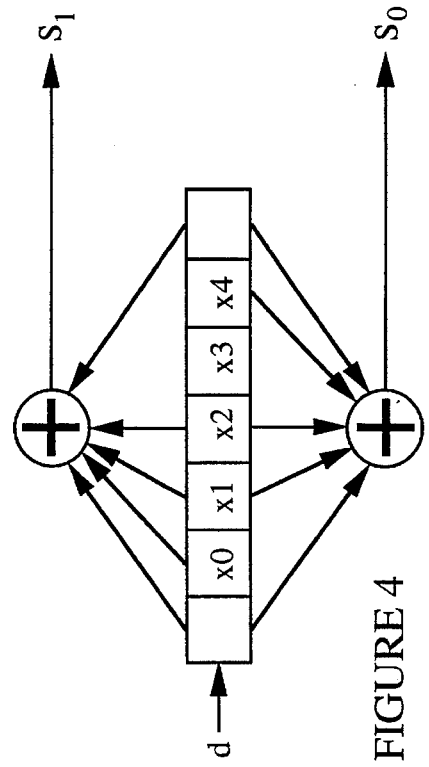
FIG. 4 is a graphical representation of a convolutional encoder for use in explanation of data content hypothesis with respect to FIG. 3.

Convolutional encoder 18 in the exemplary embodiment is a rate ½, K=7 convolutional encoder which convolutionally encodes each input bit $\delta$ so as to provide two corresponding output bits or symbols (b, c). Techniques for the convolutional encoding of bit $\delta$, along with circuit designs for convolutional encoders, are well known in the art. As illustrated in FIG. 4, convolutional encoder 18 is comprised of a seven bit tapped shift register and a pair of summers so as to generate the bits (b, c). The bits (b, c) output from encoder 10 are provided as inputs to modem 12. The bits (b, c) as provided as inputs to modem 12 become the least significant bits of the phase point value, illustrated in FIG. 2, for transmission of the carrier phase shifted carrier.

In a communication system using trellis coded modulation, it is necessary to encode the data in a manner that also permits a decoding of the data while overcoming the phase ambiguities caused by the transmission channel. Phase ambiguity resolution encoder circuit 14, is used in the encoding process to permit phase ambiguities of 90°, 180° and 270° to be resolved at the decoder. Further discussion on the implementation at the encoder and decoder of a method for resolving these phase ambiguities is found in the copending application "METHOD AND APPARATUS FOR RESOLVING PHASE AMBIGUITIES IN TRELLIS CODED MODULATED DATA", application Ser. No. 695, 397 filed May 3, 1991, and assigned to the assignee of the present invention.

Phase ambiguities of 45°, 135°, 225° and 315° are resolved at the decoder by monitoring the Viterbi decoder state metric growth rate, i.e. normalization rate, and providing a branch metric shift along with a shift in the sector value. Further details on the resolution of these particular phase ambiguities are described later herein.

As illustrated in FIG. 1, the bit $\alpha$ of the current bit pair ($\alpha$, $\beta$) is input to circuit 14 along with the most significant bit, bit b, of the bit pair (b, c) output from encoder 18. Circuit 14 performs a multiplexed differential encoding operation as described in the above mentioned copending application. The output bit a from circuit 14 is provided as the most significant bit of the phase point value as an input to modem 12. Modem 12 assembles the data bits a, b and c in order with the bits a and c respectively being the most significant and least significant bits of a three-bit phase point value. Modem 12 provides the shifted phase carrier signal (φ) as discussed below.

As mentioned previously, FIG. 2 illustrates the signal space for 8-PSK modulation for trellis coded data. The signals used in 8-PSK modulation are proportional to:

$$S_i = \sin(\pi i/4) \tag{8}$$

for i=0, 1, ..., 7, where the signal space is defined by eight sectors $Z_i$ such that the signal point $S_i$ falls at the beginning of a sector $Z_i$. In FIG. 2, the sectors $Z_i$ are numbered as indicated by the corresponding underlined numeral within each sector. It should be understood that various numbering schemes may be used for the sector numbers and the one provided herein is merely for illustration purposes.

The phase of any point within sector $Z_i$ can be expressed by the following relationship:

$$\frac{\pi i}{4} \leq \emptyset < \frac{\pi(i+1)}{4} \tag{9}$$

for i=0, 1, ..., 7.

In the 8-PSK modulation scheme, each sector $Z_i$ in which the signal $S_i$ corresponds is represented in binary form by a three-bit binary sector value (A, B, C) representative of that sector according to the exemplary mapping scheme illustrated in FIG. 2 and Table I. In other words, the bit A which is the most significant bit of the sector value, identifies the half plane, while the bits (B, C) identify the sector within the half plane.

With reference to signal transmission, the bits (a, b, c) represent a phase point value for carrier phase modulation as set forth in equation (2). In the transmission scheme a modified gray code is preferably used with respect to phase points value mapping. As an example, a phase point value (a, b, c) of 111 would correspond to a phase shift θ of 270° in the carrier as transmitted.

In the absence of channel interference the transmitted phase shift θ would be the same as the received phase shift θ̂. Typically however, channel interference provides a phase shift in the received signal from that of the transmitted signal. Thus the phase shift of the signal as received is different from the transmitted signal due to a channel interference induced phase shift. In order to accommodate these shifts in phase the sector mapping scheme is employed. At the decoder the received signal, whose phase falls within a sector of the mapping scheme of FIG. 2, is assigned a corresponding sector value. In the example above, a received signal having a phase shift between 270°–315° would fall within sector number 6($Z_6$) and would correspond to a three-bit binary sector value of 111. Table I provides a correlation between sector numbers and sector values.

TABLE I

| SECTOR NUMBER | SECTOR VALUE |
|---|---|
| 0 | 000 |
| 1 | 001 |
| 2 | 010 |
| 3 | 011 |
| 4 | 100 |
| 5 | 101 |
| 6 | 110 |
| 7 | 111 |

It should be understood that each sector value corresponds to one sector, or wedge, of the IQ planes of FIG. 2. It is critical to understand that the sector values are not the same as traditional "decision regions". Decision regions are generally centered on the transmitted phase points, while in this discussion sectors are immediately counter-clockwise from the phase points. Decision regions normally associated with PSK modem designs are not relevant to the present discussion.

In a communication system which utilizes TCM with M-ary PSK modulation without an absolute phase reference, the receiver (decoder) phase can differ from the transmitter (encoder) phase, i.e. a phase shift in the transmitted data with respect to the received data, as discussed above. In the case of 8-PSK modulation, the receiver may differ from the transmitter phase by 0°, 45°, 90°, 135°, 180°, 225°, 270° or 315°.

The phase shifts of 45°, 135°, 225° and 315° are detected by a Viterbi or convolutional decoder at the receiver since in these cases the effective error rate of the channel in the absence of noise is 50%. A technique used for detecting these particular phase shifts is monitoring the growth of the state metrics, i.e the normalization rate of the state metrics is abnormally high. Upon detecting this phase condition, correction may be made by shifting the branch metrics and sector value by simply stepping ahead by π/4 in the signal space. The present invention provides an implementation of a branch metrics and sector value rotation technique to overcome such phase ambiguities.

Phase shifts of 90°, 180° and 270° which are undetected by the Viterbi decoder must also be corrected. Details on one method for providing a resolution of these phase ambiguities at the decoder are provided in the above mentioned copending application.

As mentioned previously, the power in trellis coding lies in that even though no apparent coding operation has been performed on any bit other than the least significant bit of the input data, the decoder is still able to provide error correction on all bits. In order to support this property of trellis coding the received signal information provided to the decoder is used to determine how far the signal is from each of the eight possible receiver phases for 8-PSK modulation (sixteen for 16-PSK). The decoder uses this distance information in the decision making process to make a decision about all bits in the data.

Before considering the trellis decoder, a brief discussion of the properties of a non-trellis decoder is helpful in understanding the invention. The fundamental concept of a K=7 Viterbi decoder is that it is a machine that hypothesizes each of the possible 64 states that the encoder could have been in and determines the probability that the encoder transitioned from each of those states to the next set of 64 possible encoder states, given what was received. The probabilities are represented by quantities called metrics, which are proportional to the the negative of the logarithm of the probability. Adding of the metrics is therefore the equivalent to the negative of the product of the probabilities. Thus smaller metrics correspond to higher probability events. There are two types of metrics: state metrics, sometimes called path metrics; and branch metrics. The state metric represents the probability that the received set of symbols leads to the state with which it is associated. The branch metric represents the conditional probability that the transition from one state to another occurred assuming that the starting state was actually the correct state and given the symbol that was actually received.

Figure 3:
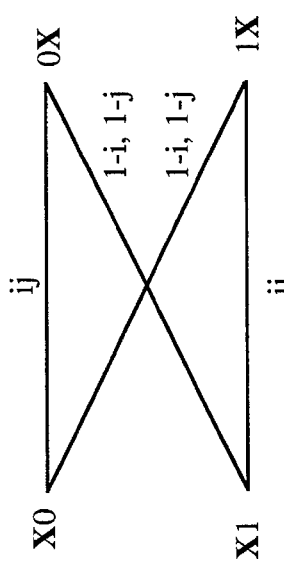
FIG. 3 is a graph illustrating a butterfly diagram of the possible state transitions in a Viterbi decoder.

There are two possible states leading to any other state, each corresponding to having a zero or a one in the rightmost bit of the convolutional encoder shift register. The decoder decides which is the more likely state by an add-compare-select operation in which the branch metric for each transition is added to the path metric for each possible originating state. FIG. 3 illustrates a butterfly diagram depicting the possible transitions to two of the 64 possible states, with 32 butterfly diagrams needed to to depict the entire decoder operation.

Butterfly diagrams are often used to discuss the behavior of a small portion of the decoder state trellis since they group together pairs of states that use the same quantities to do their calculations. In FIG. 3, the value X is actually a five-bit quantity where X=[x0, x1, x2, x3, x4]. The value X corresponds to what bits are hypothesized for the middle five bit content of an encoder (FIG. 4) for a given state being considered. In the usage of terminology, a 1 or a 0 preceding the value X corresponds to a 1 or 0 as the left most bit of the encoder, respectively. Similarly, a 1 or a 0 following the value X corresponds to a 1 or 0 as the right most bit of the encoder, respectively. In the decoder, add-compare-select circuitry stores the state metric for states X0 and X1 and upon receiving a new symbol pair s0 and s1 computes a branch metric for each of the four transitions. The branch metric is dependent only upon the value of the received symbol pair (s0, s1) and the hypothesized symbol pair (i, j) or (1-i, 1-j), and is a measurement of the distance between the two. The values (i, j) result if the encoder transitions from X0 to 0X or from X1 to 1X. In example, for a transition from X0 to 0X the content of the encoder would correspond to [0, x0, x1, x2, x3, x4, 0]. The values (1-i, 1-j) result if the encoder transitions from X0 to 1X or from X1 to 0X. Since both ends of the encoder of FIG. 4 are coupled to both summers a transition from X0 to 0X produces the same (i, j) as the transition from X1 to 1X.

The add-compare-select circuitry adds the branch metric to the state metric for each of the two transitions leading to a given state and decides that the most likely path came from the transition that yields the smaller sum. The smaller sum then becomes the new state metric for the destination state. A one bit quantity is stored to indicate which of the two transitions was selected. The decision bit is essentially the 1 or 0 in the X0 or X1 on the left of the butterfly that was chosen as the winner. A subsequent circuit, called the path memory, stores these decisions and provides the ability to start at the state with the greatest likelihood of heading the correct path and trace back through the decisions to recreate a history of the best decisions at each new input bit time for the last several constraint lengths. Since these decision bits represent the most likely set of bits hypothesized to have been passed through the encoder, they are the best data that can be output by the decoder. The further back in the decision history the trace goes, the better likelihood that the selected path merges with the correct path. In the exemplary embodiment of the present implementation of a Viterbi decoder a traceback between 98 and 126 symbol times is utilized.

An Ungerboeck-style trellis decoder based on the standard K=7 code works in a similar fashion. In the rate ⅔ trellis decoder used for 8-PSK modulation, for example, it is possible to hypothesize two different outputs for each encoder transition being considered. For the transition form X0 to 0X, the encoder might have output 0ij or 1ij depending on the value of the uncoded bit. The add-compare-select circuitry thus must have to do four computations leading into each state, and they have to resolve a four way comparison.

The decision-making process can be simplified by taking advantage of the fact that the choice between any two paths that originate at the same state is based only on the branch metrics for 0ij and 1ij, and this choice can be made prior to the decision about whether state X0 or X1 was the most likely starting state. This fact is very important since it means that the same add-compare-select circuitry can be used for trellis decoding as for the standard code as long as the choice between branch 0ij and 1ij is made prior to the add-compare-select operation. As in the non-trellis case, the branch metrics are based on the Euclidean distance between the received signal and the hypothesized signal.

The simplest way to conceive the decision making process is that when the add-compare-select circuitry makes its decision in the trellis mode, it make a two bit decision. The first decision bit, corresponding to the oldest input bit to the encoder, is generated and used in exactly the same way as in a non-trellis mode. However the second decision bit, corresponding to the bit α input to the encoder, is the 0 or 1 in the winner between the 0ij and 1ij, or 0(1-i)(1-j) and 1(1-i)(1-j). The second decision bit would also be stored in the path memory paired with the first decision bit but not used for traceback. Traceback uses the first decision bit, but when the traceback is completed and a decision bit is selected for output, the corresponding second decision bit would also be output. The rate ¾ decoder for 16-PSK can be described in essentially the same manner except that an eight way add-compare-select circuitry is required. Furthermore the path memory has to deal two decision bits in addition to the bits used for the traceback.

In the just described implementation of a trellis decoder, the path memory doubles in size for 8-PSK and triples for 16-PSK as compared to the non-trellis cases. The present invention utilizes a second simplification of the Viterbi algorithm which only requires the addition of a small section of memory to the path memory. In this simplification decisions about the second decision bit are made only after the chainback is completed.

In the implementation of the decoder of the present invention, then symbols are input to the decoder also input is a sector value as discussed above with reference to FIG. 2. The sector value is saved within the decoder until a decision is made about the bit δ that originally entered the encoder shift register. The estimate of the bit δ is re-encoded to generate the best possible estimates of the bits (b, c). Given these two bits, there are only two possible phases that could have been transmitted. For the 16-PSK case there are four possible phases. The phase closest in Euclidian distance to the sector that actually was received is determined to be the most likely phase. Thus an estimate of the most significant bit (a) of the three-bit quantity (a, b, c) is generated to complete the decision output of estimates of (α, β).

FIG. 5 illustrates an exemplary embodiment of a modem 30 and TCM decoder 32 of the present invention configured for demodulation of an 8-PSK signal where no phase reference is provided. Modem 30 receives the phase shifted carrier signal $\hat{\phi}$ which contains information in the form of the phase shift in the carrier. However channel conditions may arise which can result in a phase shift in the transmitted signal φ. The received signal $\hat{\phi}$ may be expressed by the following equation:

$$\hat{\phi} = \tilde{\ } \cos(2\pi f_c t + \hat{\theta}) = \tilde{\ } \cos(2\pi f_c + \theta + \Psi) \tag{10}$$

where Ψ is the phase shift induced by the transmission channel.

Modem 30 converts the received signal $\hat{\phi}$ to quantized I and Q components where:

$$\hat{\phi} = \hat{I} \cos(2\pi f_c t) + \hat{Q} \sin(2\pi f_c t). \tag{11}$$

The I and Q components are provided to decoder 32 where the I and Q components are converted to a three-bit sector value (A, B, C). Modem circuitry and techniques well known in the art may be utilized to convert the phase of the received signal to I and Q components. Modem 30 may further include an antenna system, RF circuitry and frequency downconversion circuitry necessary to convert the received signal to baseband as is well known in the art.

Modem 30 provides an output of the I and Q components to decoder 32 for decoding and error correction. Decoder 32 is comprised of arctangent lookup table 34, branch metrics lookup table 36; sector value lookup table 38; Viterbi decoder 40; normalization rate detection circuitry 42; differential decoder 44; convolutional encoder 46; delay circuit 48; sector rotation logic 50; trellis decision circuit or output mapper 52 and phase ambiguity resolution encoder circuit 54.

Viterbi decoder 40 in an exemplary implementation is comprised of an input processor section 56 which includes branch metrics rotation logic; state metrics computational section 58 and decision chainback computational section 60. In an equally applicable configuration Viterbi decoder 40 may be in a form of one of the many commercially available devices. With the exclusion of lookup tables 34, 36 and 38 along with normalization rate detection circuitry 42, decoder 32 is preferably of a single chip VLSI construction with the elements thereof of conventional design. Lookup tables 34, 36 and 38 along with circuitry 42 may also be of a conventional design as provided on a single VLSI chip with the other elements of decoder 32. However it is preferred that these elements be provided separately to enable greater design flexibility for the end user. It should also be understood that convolutional encoder 46 may be integrated within Viterbi decoder 40.

The I and Q components are provided to arctangent lookup table 34 which is typically implemented as a read only memory (ROM) which stores values of $\hat{\theta}$ and amplitude values R corresponding to the I and Q values which address the memory.

Each value of $\hat{\theta}$ output from lookup table 34 is provided to branch metrics lookup table 36 and sector value lookup table 38, also typically in ROM form. The value of R corresponding to each value of $\hat{\theta}$ is also provided to lookup table 36. Lookup tables 36 and 38 respectively store branch metrics and a three-bit sector value corresponding to each value of $\hat{\theta}$, the value $\hat{\theta}$ being to address the memories. With reference to FIG. 2, for a received value of $\hat{\theta}$ which falls within a particular sector the corresponding sector number is output from lookup table 38 to delay circuit 46. Similarly, for a received value of $\hat{\theta}$ corresponding branch metrics are output from lookup table 36 to input processor section 56 of Viterbi decoder 40. An exemplary illustration of the relationship between the received value of $\hat{\theta}$ and the corresponding branch metrics is provided in Table II set forth below. In a preferred implementation of the invention which provides greater user flexibility, the branch metrics are determined outside of Viterbi decoder 40 using an external branch metric lookup table, lookup table 36. It should be understood however, that in other implementations of Viterbi decoder 40 the branch metrics may be determined within Viterbi decoder 40 using an internal branch metric lookup table. In the case of the internal branch metric generation only the $\hat{\theta}$ value, and possibly the amplitude value R, need be provided thereto.

Table II illustrates in in exemplary form one option of how to quantize and assign branch metrics for 8 PSK trellis codes. Table II may also be used for establishing branch metrics for 16 PSK trellis codes as discussed later herein. Other branch metric assignment options are possible and performance improvement that can be gained depends on the statistic of the channel. Assuming that the received signal has already been quantized by the modem, and has an amplitude R and phase $\hat{\theta}$. Four three-bit branch metrics ($R_{00}$, $R_{01}$, $R_{11}$ and $R_{10}$) are assigned according to the following rules:

Rule I: If R<Threshold, erase the symbol, i.e. $R_{00}=R_{01}=R_{11}=R_{10}=0$.

Rule II. For 8-PSK, define a new phase $\phi=\theta$ mod 180 and use Table II.

In order to implement Rule I, logic is provided with lookup table 36 which compares the value R with an amplitude threshold value. In Table II the values for the branch metrics are represented by a base ten number for purposes of illustration.

TABLE II

| I | $\phi$ FROM | $\phi$ TO | $R_{00}$ | $R_{01}$ | $R_{11}$ | $R_{10}$ |
|---|---|---|---|---|---|---|
| 0 | 0.0 | 1.4 | 0 | 4 | 7 | 4 |
| 1 | 1.4 | 2.8 | 0 | 4 | 7 | 4 |
| 2 | 2.8 | 4.2 | 0 | 3 | 7 | 4 |
| 3 | 4.2 | 5.6 | 0 | 3 | 7 | 4 |
| 4 | 5.6 | 7.0 | 0 | 3 | 7 | 4 |
| 5 | 7.0 | 8.4 | 0 | 3 | 7 | 4 |
| 6 | 8.4 | 9.8 | 0 | 2 | 6 | 4 |
| 7 | 9.8 | 11.3 | 0 | 2 | 6 | 4 |
| 8 | 11.3 | 12.7 | 0 | 2 | 6 | 4 |
| 9 | 12.7 | 14.1 | 0 | 2 | 6 | 4 |
| 10 | 14.1 | 15.5 | 0 | 1 | 5 | 4 |
| 11 | 15.5 | 16.9 | 0 | 1 | 5 | 4 |
| 12 | 16.9 | 18.3 | 0 | 1 | 5 | 4 |
| 13 | 18.3 | 19.7 | 0 | 1 | 5 | 4 |
| 14 | 19.7 | 21.1 | 0 | 0 | 4 | 4 |
| 15 | 21.1 | 22.5 | 0 | 0 | 4 | 4 |
| 16 | 22.5 | 23.9 | 0 | 0 | 4 | 4 |
| 17 | 23.9 | 25.3 | 0 | 0 | 4 | 4 |
| 18 | 25.3 | 26.7 | 1 | 0 | 4 | 5 |
| 19 | 26.7 | 28.1 | 1 | 0 | 4 | 5 |
| 20 | 28.1 | 29.5 | 1 | 0 | 4 | 5 |
| 21 | 29.5 | 30.9 | 1 | 0 | 4 | 5 |
| 22 | 30.9 | 32.3 | 2 | 0 | 4 | 6 |
| 23 | 32.3 | 33.8 | 2 | 0 | 4 | 6 |
| 24 | 33.8 | 35.2 | 2 | 0 | 4 | 6 |
| 25 | 35.2 | 36.6 | 2 | 0 | 4 | 6 |
| 26 | 36.6 | 38.0 | 3 | 0 | 4 | 7 |
| 27 | 38.0 | 39.4 | 3 | 0 | 4 | 7 |
| 28 | 39.4 | 40.8 | 3 | 0 | 4 | 7 |
| 29 | 40.8 | 42.2 | 3 | 0 | 4 | 7 |
| 30 | 42.2 | 43.6 | 4 | 0 | 4 | 7 |
| 31 | 43.6 | 45.0 | 4 | 0 | 4 | 7 |
| 32 | 45.0 | 46.4 | 4 | 0 | 4 | 7 |
| 33 | 46.4 | 47.8 | 4 | 0 | 4 | 7 |
| 34 | 47.8 | 49.2 | 4 | 0 | 3 | 7 |
| 35 | 49.2 | 50.6 | 4 | 0 | 3 | 7 |
| 36 | 50.6 | 52.0 | 4 | 0 | 3 | 7 |
| 37 | 52.0 | 53.4 | 4 | 0 | 3 | 7 |
| 38 | 53.4 | 54.8 | 4 | 0 | 2 | 6 |
| 39 | 54.8 | 56.3 | 4 | 0 | 2 | 6 |
| 40 | 56.3 | 57.7 | 4 | 0 | 2 | 6 |
| 41 | 57.7 | 59.1 | 4 | 0 | 2 | 6 |
| 42 | 59.1 | 60.5 | 4 | 0 | 1 | 5 |
| 43 | 60.5 | 61.9 | 4 | 0 | 1 | 5 |
| 44 | 61.9 | 63.3 | 4 | 0 | 1 | 5 |
| 45 | 63.3 | 64.7 | 4 | 0 | 1 | 5 |
| 46 | 64.7 | 66.1 | 4 | 0 | 0 | 4 |
| 47 | 66.1 | 67.5 | 4 | 0 | 0 | 4 |
| 48 | 67.5 | 68.9 | 4 | 0 | 0 | 4 |
| 49 | 68.9 | 70.3 | 4 | 0 | 0 | 4 |
| 50 | 70.3 | 71.7 | 5 | 1 | 0 | 4 |
| 51 | 71.7 | 73.1 | 5 | 1 | 0 | 4 |
| 52 | 73.1 | 74.5 | 5 | 1 | 0 | 4 |

TABLE II-continued

| I | φ FROM | TO | $R_{00}$ | $R_{01}$ | $R_{11}$ | $R_{10}$ |
|---|---|---|---|---|---|---|
| 53 | 74.5 | 75.9 | 5 | 1 | 0 | 4 |
| 54 | 75.9 | 77.3 | 6 | 2 | 0 | 4 |
| 55 | 77.3 | 78.8 | 6 | 2 | 0 | 4 |
| 56 | 78.8 | 80.2 | 6 | 2 | 0 | 4 |
| 57 | 80.2 | 81.6 | 6 | 2 | 0 | 4 |
| 58 | 81.6 | 83.0 | 7 | 3 | 0 | 4 |
| 59 | 83.0 | 84.4 | 7 | 3 | 0 | 4 |
| 60 | 84.4 | 85.8 | 7 | 3 | 0 | 4 |
| 61 | 85.8 | 87.2 | 7 | 3 | 0 | 4 |
| 62 | 87.2 | 88.6 | 7 | 4 | 0 | 4 |
| 63 | 88.6 | 90.0 | 7 | 4 | 0 | 4 |
| 64 | 90.0 | 91.4 | 7 | 4 | 0 | 4 |
| 65 | 91.4 | 92.8 | 7 | 4 | 0 | 4 |
| 66 | 92.8 | 94.2 | 7 | 4 | 0 | 3 |
| 67 | 94.2 | 95.6 | 7 | 4 | 0 | 3 |
| 68 | 95.6 | 97.0 | 7 | 4 | 0 | 3 |
| 69 | 97.0 | 98.4 | 7 | 4 | 0 | 3 |
| 70 | 98.4 | 99.8 | 6 | 4 | 0 | 2 |
| 71 | 99.8 | 101.3 | 6 | 4 | 0 | 2 |
| 72 | 101.3 | 102.7 | 6 | 4 | 0 | 2 |
| 73 | 102.7 | 104.1 | 6 | 4 | 0 | 2 |
| 74 | 104.1 | 105.5 | 5 | 4 | 0 | 1 |
| 75 | 105.5 | 106.9 | 5 | 4 | 0 | 1 |
| 76 | 106.9 | 108.3 | 5 | 4 | 0 | 1 |
| 77 | 108.3 | 109.7 | 5 | 4 | 0 | 1 |
| 78 | 109.7 | 111.1 | 4 | 4 | 0 | 0 |
| 79 | 111.1 | 112.5 | 4 | 4 | 0 | 0 |
| 80 | 112.5 | 113.9 | 4 | 4 | 0 | 0 |
| 81 | 113.9 | 115.3 | 4 | 4 | 0 | 0 |
| 82 | 115.3 | 116.7 | 4 | 5 | 1 | 0 |
| 83 | 116.7 | 118.1 | 4 | 5 | 1 | 0 |
| 84 | 118.1 | 119.5 | 4 | 5 | 1 | 0 |
| 85 | 119.5 | 120.9 | 4 | 5 | 1 | 0 |
| 86 | 120.9 | 122.3 | 4 | 6 | 2 | 0 |
| 87 | 122.3 | 123.8 | 4 | 6 | 2 | 0 |
| 88 | 123.8 | 125.2 | 4 | 6 | 2 | 0 |
| 89 | 125.2 | 126.6 | 4 | 6 | 2 | 0 |
| 90 | 126.6 | 128.0 | 4 | 7 | 3 | 0 |
| 91 | 128.0 | 129.4 | 4 | 7 | 3 | 0 |
| 92 | 129.4 | 130.8 | 4 | 7 | 3 | 0 |
| 93 | 130.8 | 132.2 | 4 | 7 | 3 | 0 |
| 94 | 132.2 | 133.6 | 4 | 7 | 4 | 0 |
| 95 | 133.6 | 135.0 | 4 | 7 | 4 | 0 |
| 96 | 135.0 | 136.4 | 4 | 7 | 4 | 0 |
| 97 | 136.4 | 137.8 | 4 | 7 | 4 | 0 |
| 98 | 137.8 | 139.2 | 3 | 7 | 4 | 0 |
| 99 | 139.2 | 140.6 | 3 | 7 | 4 | 0 |
| 100 | 140.6 | 142.0 | 3 | 7 | 4 | 0 |
| 101 | 142.0 | 143.4 | 3 | 7 | 4 | 0 |
| 102 | 143.4 | 144.8 | 2 | 6 | 4 | 0 |
| 103 | 144.8 | 146.3 | 2 | 6 | 4 | 0 |
| 104 | 146.3 | 147.7 | 2 | 6 | 4 | 0 |
| 105 | 147.7 | 149.1 | 2 | 6 | 4 | 0 |
| 106 | 149.1 | 150.5 | 1 | 5 | 4 | 0 |
| 107 | 150.5 | 151.9 | 1 | 5 | 4 | 0 |
| 108 | 151.9 | 153.3 | 1 | 5 | 4 | 0 |
| 109 | 153.3 | 154.7 | 1 | 5 | 4 | 0 |
| 110 | 154.7 | 156.1 | 0 | 4 | 4 | 0 |
| 111 | 156.1 | 157.5 | 0 | 4 | 4 | 0 |
| 112 | 157.5 | 158.9 | 0 | 4 | 4 | 0 |
| 113 | 158.9 | 160.3 | 0 | 4 | 4 | 0 |
| 114 | 160.3 | 161.7 | 0 | 4 | 5 | 1 |
| 115 | 161.7 | 163.1 | 0 | 4 | 5 | 1 |
| 116 | 163.1 | 164.5 | 0 | 4 | 5 | 1 |
| 117 | 164.5 | 165.9 | 0 | 4 | 5 | 1 |
| 118 | 165.9 | 167.3 | 0 | 4 | 6 | 2 |
| 119 | 167.3 | 168.8 | 0 | 4 | 6 | 2 |
| 120 | 168.8 | 170.2 | 0 | 4 | 6 | 2 |
| 121 | 170.2 | 171.6 | 0 | 4 | 6 | 2 |
| 122 | 171.6 | 173.0 | 0 | 4 | 7 | 3 |
| 123 | 173.0 | 174.4 | 0 | 4 | 7 | 3 |
| 124 | 174.4 | 175.8 | 0 | 4 | 7 | 3 |
| 125 | 175.8 | 177.2 | 0 | 4 | 7 | 3 |
| 126 | 177.2 | 178.6 | 0 | 4 | 7 | 4 |
| 127 | 178.6 | 180.0 | 0 | 4 | 7 | 4 |

The branch metrics are provided as an output from lookup table 36 as an input to input processor section 56 of Viterbi decoder 40. Input processor section 56 includes branch metric rotation logic whose structure and function is described in further detail later herein. Input processor section 56 is of conventional design for providing input sample timing and synchronization. Furthermore input processor section 56 may provide internal branch metrics for use of Viterbi decoder outside of the trellis mode in other circuits for the decoding of various rate data. The branch metrics are provided from input processor section 56 to state metrics computational section 58.

State metrics computational section 58 is a standard add, compare, and select circuit as is well known in the art. An example of such a circuit is found in a Viterbi decoder Part No. Q0256 of Qualcomm, Inc. of San Diego, Calif. The values output from state metrics computational section 58 are provided to decision chainback computational section 60. Also provided as an output from state metrics computational section 58 is a signal indicative of the growth of the state metrics. This signal is provided to normalization rate detection circuitry 42.

As is known in the art of Viterbi decoders, using the normally selected branch metrics under channel phase shift conditions of 45°, 135°, 225° and 315° would produce erroneous estimates of the original data. Further as is known, Viterbi decoders alone are not capable of detecting that the data is in error as a result of these conditions of channel phase shift. Normalization rate detection circuitry 42 is thus used to detect an abnormally high normalization rate indicative of channel phase shifts of 45°, 135°, 225° and 315°. Upon a detection of the abnormally high growth rate of the state metrics, normalization rate detection circuitry 42 provides a phase shift signal to input processor section 56 and to sector rotation logic 50. To correct for this condition, the branch metric rotation logic within input processor section 56 is responsive to the phase shift signal so as to provide a shift in the branch metrics corresponding to a shift of π/4 in the signal space, i.e. branch metrics corresponding to a 45° degree shift in the signal space.

Furthermore as discussed later herein the phase shift signal is used by sector rotation logic to provide a corresponding π/4 shift in the signal space for the sector value bits (A, B, C). A π/4 shift in the sector value results in the sector value corresponding to a phase shift of 0°, 90°, 180° and 270°. Undergoing one of the phase shifts, Viterbi decoder 40 is then capable of recovering the data.

The values output from state metrics computational section 58 are provided to decision chainback computational section 60 which is comprised of a chainback memory and associated logic as is also well known in the art. The chainback memory is preferably implemented as a 4 by 40 by 64 bit memory which performs 4 read operation for every write operation. The arrangement of memory provides a memory depth of 96 with 100% memory utilization. The output from decision chainback computational section 60 is the best estimate of the transmitted data bit δ, with this estimate denoted as by the reference character $\hat{\delta}$.

Decoder 40 provides an output of the bit $\hat{\delta}$ as an input to both differential decoder 44 and convolutional encoder 46. Since the bit $\hat{\delta}$ was differentially encoded prior to convolutional encoding on the transmit end, on the receive end the differential encoding on the bit $\hat{\delta}$ must be decoded to recover the bit $\hat{\delta}$. Differential decoder thus differentially decodes the input bit bit $\hat{\delta}$ so as to provide the output bit $\hat{\beta}$ which is an estimate of the originally encoded bit $\beta$.

The bit $\hat{\delta}$ output from decoder 40 is provided as an input of convolutional encoder 46 so as to produce bits ($\hat{b}$, $\hat{c}$) which are corrected estimates of the transmitted phase point bits (b, c). The most significant bit ($\hat{b}$) of the bit pair ($\hat{b}$, $\hat{c}$) is output from convolutional encoder 46 to phase ambiguity resolution decoder circuit 54. The bit pair ($\hat{b}$, $\hat{c}$) is also provided as an input to trellis output mapper 52.

In response to the value $\hat{\theta}$ provided to sector value lookup table 38, a three-bit sector value (A, B, C) is provided which is the serial number of the sector. Lookup table 38 assigns a sector value to the received phase value $\hat{\theta}$ corresponding to the sector in which the signal phase fell as illustrated in FIG. 2 and Table I.

The sector value (A, B, C) output from lookup table 38 is provided to delay circuit 48 for providing a delay in the propagation of the sector value. This delay is necessary to provide correspondence between the output of lookup table 38 and the output of Viterbi decoder 40, which are based upon the same phase value input, due to the computational time required by the Viterbi decoder 40. Delay circuit 48 may be configured merely as a series of logic gates to provide propagation delay as is well known in the art.

The delayed sector value (A, B, C) is provided as an input to sector rotation logic 50. As mentioned previously, also provided as an input to sector rotation logic 50 is the phase shift signal from normalization rate detection circuitry 42. Sector rotation logic 50 is responsive to the phase shift signal for rotating the sector value by $\pi/4$. For example, a selected sector value of (001) would be rotated to (010). Sector rotation logic 50 may be configured using conventional Karnaugh mapping techniques to provide the appropriate output sector value for a corresponding input sector value in both the normal and phase shift conditions. As an alternative sector rotation logic may be implemented as a ROM in which under normal conditions the stored output sector value corresponds to the input sector value. However in response to the phase shift signal the output sector value from the ROM corresponds to the shifted sector value.

The output sector value from sector rotation logic 50 is provided to trellis output mapper 52 along with the re-encoded bits ($\hat{b}$, $\hat{c}$) from convolutional encoder 46. Trellis output mapper 52 provides in response to the sector value bits (A, B, C) and the re-encoded bits ($\hat{b}$, $\hat{c}$) an output bit $\hat{a}$ which corresponds to a corrected estimate of the most significant bit of the originally transmitted phase point, the uncoded bit a. The bit $\hat{a}$ is determined in trellis output mapper 52 in accordance with Table III.

TABLE III

| SECTOR NO. | SECTOR VALUE (A, B, C) | ($\hat{b}$, $\hat{c}$) (0, 0) $\hat{a} =$ | (0, 1) $\hat{a} =$ | (1, 1) $\hat{a} =$ | (1, 0) $\hat{a} =$ |
|---|---|---|---|---|---|
| 0 | 000 | 0 | 0 | 0 | 1 |
| 1 | 001 | 0 | 0 | 0 | 0 |
| 2 | 010 | 1 | 0 | 0 | 0 |
| 3 | 011 | 1 | 1 | 0 | 0 |
| 4 | 100 | 1 | 1 | 1 | 0 |

TABLE III-continued

| SECTOR NO. | SECTOR VALUE (A, B, C) | ($\hat{b}$, $\hat{c}$) (0, 0) $\hat{a} =$ | (0, 1) $\hat{a} =$ | (1, 1) $\hat{a} =$ | (1, 0) $\hat{a} =$ |
|---|---|---|---|---|---|
| 5 | 101 | 1 | 1 | 1 | 1 |
| 6 | 110 | 0 | 1 | 1 | 1 |
| 7 | 111 | 0 | 0 | 1 | 1 |

An example of the derision process for the bit $\hat{a}$ is as follows. For purposes of this example there is no phase shift which causes a branch metric or sector rotation, or of a nature which requires other phase ambiguity correction. The received signal is of a phase of 100°. Using FIG. 2 and Table III, this received phase corresponds to a sector number and sector value respectively of 2 and 010. If the re-encoded bit $\hat{\delta}$ provides bits ($\hat{b}$, $\hat{c}$) of (0,1), then the two possible received phase points correspond to 001 and 101. Since the received phase of 100° is located in a sector which is closer to phase point 001 than to phase point 101, the bit $\hat{a}$ is determined to be 0. Thus output from trellis output mapper 52 is the bit $\hat{a}$ which is of the value of 0.

Trellis output mapper 52 may be configured using conventional Karnaugh mapping techniques to provide the appropriate output bit $\hat{a}$. In the alternative, trellis output mapper 52 may be implemented as a ROM in which the stored output bit $\hat{a}$ corresponds to the input sector value (A, B, C) and the re-encoded bits ($\hat{b}$, $\hat{c}$).

The output value $\hat{a}$ from trellis output mapper 52 is provided to phase ambiguity resolution decoder circuit 54 along with the re-encoded bit $\hat{b}$ from convolutional encoder 46. Phase ambiguity resolution decoder circuit 54 performs a multiplexed differential encoding operation as described in the above mentioned copending application for phase shifts of 90°, 180° and 270°. Phase ambiguity resolution decoder circuit 54 thus provides in response to the output bit $\hat{a}$ and the re-encoded bit $\hat{b}$, a bit which is the best estimate of the transmitted data bit $\alpha$, with this estimate denoted by the reference character $\hat{\alpha}$. Differential decoder 44 provides the differentially decoded bit $\hat{\delta}$ as the output bit $\hat{\beta}$ to complete the output from decoder 32.

The present invention is equally applicable to 16-PSK modulation. In the case for 16-PSK modulation, FIG. 1 also illustrates the encoder elements for this modulation scheme. In this implementation a three-bit data input is provided to encoder 10. Encoder 10 receives the three bits of input data (η, ε, ρ) and generates a corresponding four-bit phase point value (w, x, y, z).

The phase point value is output from encoder 10 to a 16-PSK phase mapper or modem 12 where the phase of a carrier signal is shifted in accordance with the data sector mapping scheme of FIG. 5. The output of modem 12 is the phase shifted carrier signal ($\phi$) as determined according to equation 1 where:

$$\theta = (w \cdot 180°) + ((w-x)^2 90°) + (y \cdot 45°) + ((y-z)^2 \cdot 22.5°) \quad (12)$$

Other than the difference in mapping as set forth by using equation 12 over equation 12, modem 12 operates in the same manner.

Data is input to encoder 10 three bits at a time, bits (η, ε, ρ), with the bits (η, ε) input to phase ambiguity resolution encoder circuit 14, and the bit ρ input to differential encoder 16. The bit ρ as input to differential encoder 16 is differentially encoded. Each differentially encoded bit or symbol ζ corresponding to an input bit ρ is output from differential encoder 16 as an input to convolutional encoder 18.

Convolutional encoder 18 again in the exemplary embodiment is a rate ½, K=7 convolutional encoder which convolutionally encodes each input bit ζ so as to provide two corresponding output bits or symbols (y, z). The bits (y, z) output from encoder 10 are provided as inputs to modem 12. The bits (y, z) as provided as inputs to modem 12 become the least significant bits of the phase point value, illustrated in FIG. 5, for transmission of the carrier phase shifted carrier.

Phase ambiguity resolution encoder circuit 14 is again used in the encoding process to permit phase ambiguities of 45°, 90°, 135°, 180°, 225°, 270° and 315° to be resolved at the decoder. Further discussion on the implementation at the encoder and decoder of a method for resolving these phase ambiguities is found in the above mentioned copending application. Phase ambiguities of 22.5°, 67.5°, 112.5°, 157.5°, 202.5°, 247.5°, 292.5°, and 337.5° are resolved at the decoder by monitoring the Viterbi decoder state metric growth rate and providing a branch metric shift along with a shift in the sector value. Further details on the resolution of these particular phase ambiguities are described later herein.

As illustrated in FIG. 1, the bits (η, ε) of the current bit group (η, ε, β) are input to circuit 14 along with the most significant bit, bit y, of the bit pair (y, z) output from encoder 18. Circuit 14 again performs a multiplexed differential encoding operation as described in the above mentioned copending application so as to provide two corresponding bits (w, x). The output bits from (w, x) circuit 14 are respectively provided as the most significant and the next to most significant bit of the phase point value as inputs to modem 12. Modem 12 assembles the data bits (w, x, y, z) in order with the bits w and z respectively being the most significant and least significant bits of a four-bit phase point value. Modem 12 provides the shifted phase carrier signal (φ) as discussed above.

Figure 6:
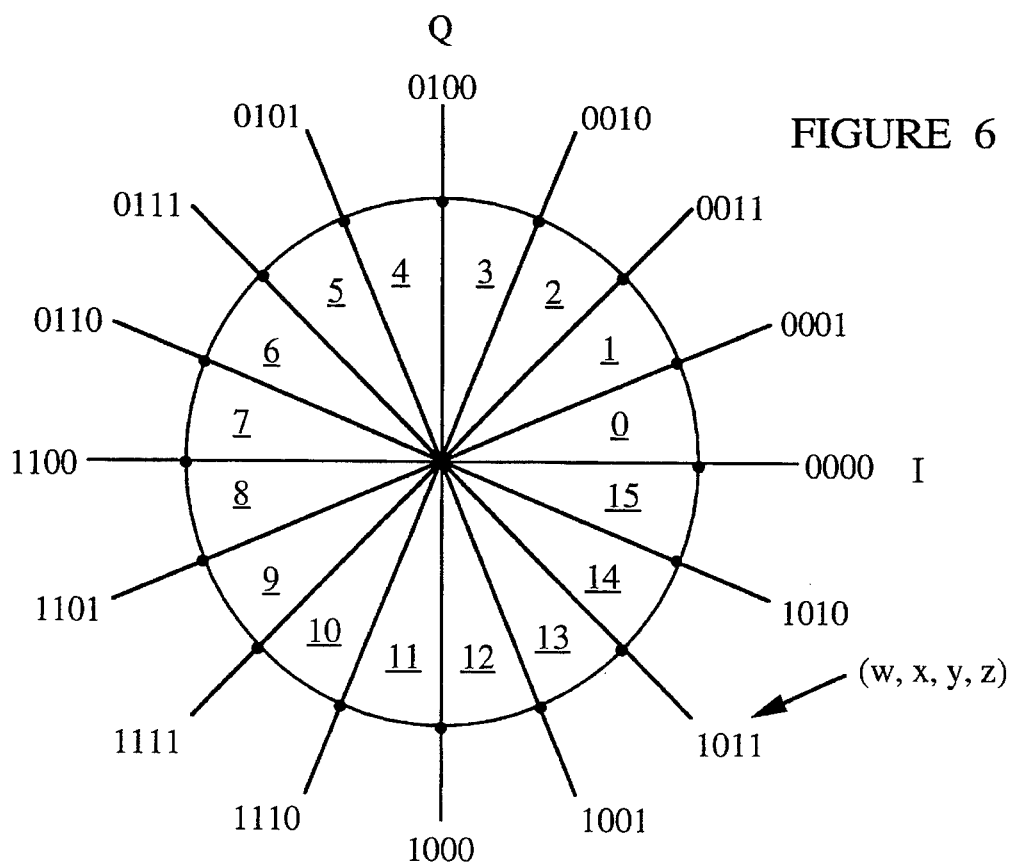
FIG. 6 is a graph illustrating the signal space for 16-PSK modulation.

In FIG. 6 a representation of the signal space for 16-PSK modulation is provided. The signal space is divided up into sixteen sectors each identified by a corresponding sector number 0–15. Associated with each sector is a four-bit phase point (transmission) or sector value (reception). As in the case for 8-PSK modulation scheme, in the 16-PSK modulation each sector in which the signal corresponds is represented in binary form by a four-bit sector value (W, X, Y, Z) representative of that sector according to the exemplary mapping scheme illustrated in FIG. 6 and Table IV. Table IV provides a correlation between sector numbers and sector values.

TABLE IV

| SECTOR NUMBER | SECTOR VALUE |
| --- | --- |
| 0 | 0000 |
| 1 | 0001 |
| 2 | 0010 |
| 3 | 0011 |
| 4 | 0100 |
| 5 | 0101 |
| 6 | 0110 |
| 7 | 0111 |
| 8 | 1000 |
| 9 | 1001 |
| 10 | 1010 |
| 11 | 1011 |
| 12 | 1100 |
| 13 | 1101 |
| 14 | 1110 |

TABLE IV-continued

| SECTOR NUMBER | SECTOR VALUE |
| --- | --- |
| 15 | 1111 |

Referring back to FIG. 5, the modem and decoder illustrated therein are also configured for 16-PSK demodulation. Modem 30 again converts the received signal φ to quantized I and Q components where provided to arctangent lookup table 34. Arctangent lookup table 34 is again stores values of θ̂ and amplitude values R corresponding to the I and Q values which address the memory. Each value of φ output from lookup table 34 is provided to branch metrics lookup table 36 and sector value lookup table 38. The value of R corresponding to each value of θ̂ is also provided to lookup table 36. Lookup tables 36 and 38 respectively store branch metrics and a four-bit sector value corresponding to each value of θ̂, the value θ̂ being used to address the memories.

With reference to FIG. 5, for a received value of θ̂ which falls within a particular sector the corresponding sector number is output from lookup table 38 to delay circuit 46. Similarly, for a received value of θ̂ corresponding branch metrics are output from lookup table 36 to input processor section 56 of Viterbi decoder 40. An exemplary illustration of the relationship between the received value of θ̂ and the corresponding branch metrics is provided in Table II set forth above. In using Table II above for 16-PSK modulation, Rule II is replace by the following rule:

Rule III. For 16-PSK, define a new phase φ=2θ mod 180 and use Table II.

Again it should be understood that in a alternative implementation of Viterbi decoder 40 only the θ̂ value need be provided to Viterbi decoder 40 with the branch metrics determined using an internal branch metric lookup table.

As is known in the art of Viterbi decoders, using the normally selected branch metrics under 16-PSK channel phase shift conditions of 22.5°, 67.5°, 112.5°, 157.5°, 202.5°, 247.5°, 292.5°, and 337.5° would produce erroneous estimates of the original data. Further as is known, Viterbi decoders alone are not capable of detecting that the data is in error as a result of these conditions of channel phase shift. Normalization rate detection circuitry 42 is thus used to detect an abnormally high normalization rate indicative of channel phase shifts of 22.5°, 67.5°, 112.5°, 157.5°, 202.5°, 247.5°, 292.5°, and 337.5° for the 16-PSK modulation. Upon a detection of the abnormally high growth rate of the state metrics, normalization rate detection circuitry 42 provides a phase shift signal to input processor section 56 and to sector rotation logic 50. To correct for this condition, the branch metric rotation logic within input processor section 56 is responsive to the phase shift signal so as to provide a shift in the branch metrics corresponding to a shift of π/8 in the signal space, i.e. branch metrics corresponding to a 22.5° degree shift in the signal space.

Furthermore as discussed later herein the phase shift signal is used by sector rotation logic 50 to provide a corresponding π/8 shift in the signal space for the sector value bits (W, X, Y, Z). Undergoing such a phase shift enables Viterbi decoder 40 then to recover the data.

As discussed before, the output from decision chainback computational section 60 is the best estimate of the transmitted data bit ζ, with this estimate denoted as by the reference character ζ̂. Decoder 40 provides an output of the bit ζ̂ as an input to both differential decoder 44 and convolutional encoder 46. Differential decoder differentially decodes the input bit bit $\zeta$ so as to provide the output bit $\hat{\rho}$ which is an estimate of the originally encoded bit $\rho$.

The bit $\zeta$ output from decoder 40 is provided as an input of convolutional encoder 46 so as to produce bits $(\hat{y}, \hat{z})$ which are corrected estimates of the transmitted phase point bits (y, z). The most significant bit $(\hat{y})$ of the bit pair $(\hat{y}, \hat{z})$ is output from convolutional encoder 46 to phase ambiguity resolution decoder circuit 54. The bit pair $(\hat{y}, \hat{z})$ is also provided to trellis output mapper 52.

In response to the value $\theta$ provided to sector value lookup table 38, a three-bit sector value (W, X, Y, Z) is provided. Lookup table 38 assigns a sector value to the received phase value $\theta$ corresponding to the sector in which the received signal fall as illustrated in FIG. 6 and Table IV.

The sector value (W, X, Y, Z) output from lookup table 38 is provided to delay circuit 48 for providing a delay in the propagation of the sector value for reasons discussed above. The delayed sector value (W, X, Y, Z) is provided as an input to sector rotation logic 50. As mentioned previously, also provided as an input to sector rotation logic 50 is the phase shift signal from normalization rate detection circuitry 42. Sector rotation logic 50 is responsive to the phase shift signal for rotating the sector value by $\pi/8$. For example, a selected sector value of (0001) would be rotated to (0010). Sector rotation logic 50 may again be configured using conventional Karnaugh mapping techniques to provide the appropriate output sector value for a corresponding input sector value in both the normal and phase shift conditions or a memory form.

The output sector value from sector rotation logic 50 is provided to trellis output mapper 52 along with the re-encoded bits $(\hat{y}, \hat{z})$ from convolutional encoder 46. Trellis output mapper 52 provides, in response to the sector value bits (W, X, Y, Z) and the re-encoded bits $(\hat{y}, \hat{z})$, the output bits $(\hat{w}, \hat{x})$ which correspond to a corrected estimate of the originally transmitted uncoded phase point bits (w, x). The bits $(\hat{w}, \hat{x})$ are determined in trellis output mapper 52 in accordance with Table V.

TABLE V

| SEC-TOR NO. | SECTOR VALUE (W, X, Y, Z) | $(\hat{y}, \hat{z})$ (0, 0) $\hat{w}, \hat{x}) =$ | (0, 1) $\hat{w}, \hat{x}) =$ | (1, 1) $\hat{w}, \hat{x}) =$ | (1, 0) $\hat{w}, \hat{x}) =$ |
|---|---|---|---|---|---|
| 0 | 0000 | 00 | 00 | 00 | 10 |
| 1 | 0001 | 00 | 00 | 00 | 00 |
| 2 | 0010 | 01 | 00 | 00 | 00 |
| 3 | 0011 | 01 | 01 | 00 | 00 |
| 4 | 0100 | 01 | 01 | 01 | 00 |
| 5 | 0101 | 01 | 01 | 01 | 01 |
| 6 | 0110 | 11 | 01 | 01 | 01 |
| 7 | 0111 | 11 | 11 | 01 | 01 |
| 8 | 1000 | 11 | 11 | 11 | 01 |
| 9 | 1001 | 11 | 11 | 11 | 11 |
| 10 | 1010 | 10 | 11 | 11 | 11 |
| 11 | 1011 | 10 | 10 | 11 | 11 |
| 12 | 1100 | 10 | 10 | 10 | 11 |
| 13 | 1101 | 10 | 10 | 10 | 10 |
| 14 | 1110 | 00 | 10 | 10 | 10 |
| 15 | 1111 | 00 | 00 | 10 | 10 |

An example of the decision process for the bits $(\hat{w}, \hat{x})$ is as follows. Again for purposes of this example there is no phase shift which causes a branch metric or sector rotation, or of a nature which requires other phase ambiguity correction. The received signal is of a phase of 175°. Using FIG. 5 and Table V, this received phase corresponds to a sector number and sector value respectively of 7 and 0111. If the re-encoded bit $\zeta$ provides bits $(\hat{y}, \hat{z})$ of (0,0), then the four possible received phase points correspond to 0000, 0100, 1100 and 1000. Since the received phase of 175° is located in a sector which is closer to phase point 1100, the bits $(\hat{w}, \hat{x})$ are determined to be (1,1). Thus the output from trellis output mapper 52 are the bits $(\hat{w}, \hat{x})$ which are (1,1).

Trellis output mapper 52 may again be configured using conventional Karnaugh mapping techniques to provide the appropriate output bits $(\hat{w}, \hat{x})$. In the alternative, trellis output mapper 52 may also be implemented in memory form in which the stored output bits $(\hat{w}, \hat{x})$ correspond to the input sector value (W, X, Y, Z) and the re-encoded bits $(\hat{y},\hat{z})$.

The output bit values $(\hat{w}, \hat{x})$ from trellis output mapper 52 is provided to phase ambiguity resolution decoder circuit 54 along with the re-encoded bit $\hat{y}$ from convolutional encoder 46. Phase ambiguity resolution decoder circuit 54 performs a multiplexed differential encoding operation as described in the above mentioned copending application for phase shifts of 45°, 90°, 135°, 180°, 225°, 270° and 315°. Phase ambiguity resolution decoder circuit 54 thus provides in response to the output bits $(\hat{w}, \hat{x})$ and the re-encoded bit $\hat{y}$, a bit pair which is the best estimate of the transmitted data bits ($\eta$, $\alpha$), with this estimate denoted by the reference characters ($\eta$, $\epsilon$). Differential decoder 44 provides the differentially decoded bit $\zeta$ as the output bit $\hat{\rho}$ to complete the output from decoder 32.

As mentioned previously, in the case of 8-PSK modulation channel phase shifts of 45°, 135°, 225° and 315° are indicated by an abnormally high normalization rate detected by normalization rate detection circuitry 42. Similarly is the case of 16-PSK modulation for channel phase shifts of 22.5°, 67.5°, 112.5°, 157.5°, 202.5°, 247.5°, 292.5°, and 337.5°. Normalization rate detection circuitry 42 upon detection of this condition provides the phase shift signal to Viterbi decoder input processor section 56 and to sector rotation logic 50. Sector rotation logic 50 changes the sector value as discussed above. Input processor section 56 contains branch metric rotation logic which in response to the phase shift signal correspondingly changes the branch metrics to correspond to the branch metrics of an adjacent sector. The shifted branch metrics correspond to a signal received at a 45° phase shift from the actual received signal for 8-PSK modulation and 22.5° for 16-PSK modulation.

Figure 7:
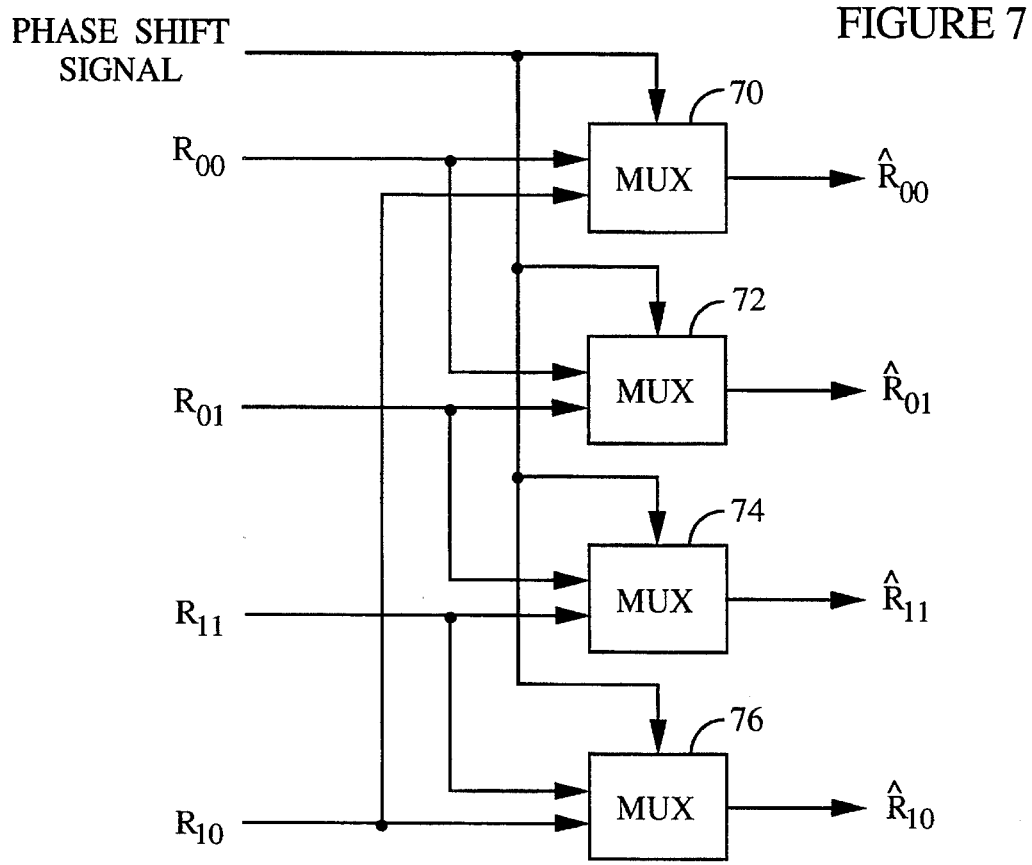
FIG. 7 is a block diagram of an exemplary embodiment of the branch metric phase shift circuitry.

FIG. 7 illustrates in block diagram form an exemplary implementation of the branch metric phase shift circuitry within input processor section. It should be understood that such circuitry may be implemented in various forms external to input processor section 56 or Viterbi decoder 40. For example logic located before or after lookup table 36 may be implemented so as to provide the necessary shift in branch metrics in response to the phase shift signal FIG. 8 is a graphical representation of the rotation in branch metrics which when taken in conjunction with Table VI below provide further explanation of the branch metric rotation process.

Figure 8:
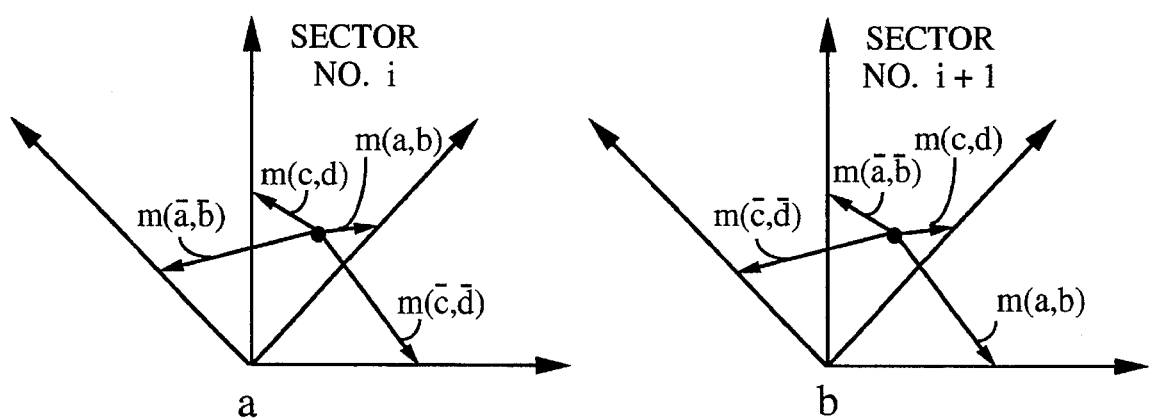
FIG. 8 is provides in graphs a and b, a graphical representation of the rotation in branch metrics.

Referring to FIG. 8, for each received signal, branch metrics are assigned corresponding to the distance in phase of the received signal with respect to the four closest phase points. In FIG. 8 the distance to the closest clockwise phase point is assigned the branch metric m(a, b) where a and b respectfully correspond to the two least significant bits of that phase point. The distance to the closest counter-clockwise phase point is assigned the branch metric m(c, d) where c and d respectfully correspond to the two least bits of that phase point. The distance to the next closest clockwise phase point is assigned the branch metric m($\bar{c}$, $\bar{d}$) where $\bar{c}$ and $\bar{d}$ respectfully correspond to the two least significant bits of that phase point. The distance to the next closest counter-clockwise sector value is assigned the branch metric m($\bar{a}$, b) where $\bar{a}$ and $\bar{b}$ respectfully correspond to the two least bits of that phase point. The overstrike ( ) above the letter corresponds to the complement of the represented bit value. Using FIG. 2 an example of the above branch metric assignment scheme for 8-PSK modulation follows. The received signal is of a phase of 120° so as to fall within sector number 2. Since the closest clockwise phase point for this signal corresponds to 011, the branch metric m(a, b) is thus identified as the branch metric m(1,1). The closest counter-clockwise phase point is the phase point 010, such that the branch metric re(c, d) is identified as branch metric m(1,0). The next closest clockwise phase point corresponds to 001 with the branch metric m($\bar{c}$, $\bar{d}$) identified as branch metric m(0,1). The next closest counter-clockwise phase point is 100, the branch metric m($\bar{a}$, $\bar{b}$) is identified as branch metric m(0,0). With respect to Table II it should be understood that the branch metrics m(0,0), m(0,1), m(1,1) and m(1,0) respectively correspond to the indicia $R_{00}$, $R_{01}$, $R_{11}$, and $R_{10}$.

Upon detection of a channel phase shift which causes the phase shift signal to be generated, a rotation of the branch metrics to those of an adjacent sector is undertaken. Table VI illustrates the change in input branch metrics for this condition.

TABLE VI

| BEFORE PHASE SHIFT | | AFTER PHASE SHIFT | |
|---|---|---|---|
| BRANCH METRICS | SECTOR NUMBER | BRANCH METRICS | SECTOR NUMBER |
| m($\overline{-c,-d}$) | i | m(a,b) | i+1 |
| m(a,b) | i | m($\bar{c},\bar{d}$) | i+1 |
| m($\bar{c},\bar{d}$) | i | m($\overline{-c,-d}$) | i+1 |
| m( ) | i | m( ) | i+1 |

FIG. 8a and 8b illustrate the branch metrics before and after a rotation. The value corresponding to the branch metrics selected for m($\bar{c}$, $\bar{d}$) is changed upon rotation to the value corresponding to the branch metric selected for m(a, b). This changed value is input to the state metrics computation section of the Viterbi decoder in place of the branch metric originally input to the Viterbi decoder. Similarly, changes are made to each of the other selected branch metrics as input to the state metrics computation section, these changes corresponding to those set forth in Table VI. Specifically, the branch metric value selected for m(a, b) is changed to the value corresponding to the branch metric value selected for m(c, d); the branch metric value selected for m(c, d) is changed to the value corresponding to the branch metric value selected for m($\bar{a}$, $\bar{b}$); and the branch metric value selected for m($\bar{a}$, $\bar{b}$) is changed to the value corresponding to the branch metric value selected for m($\bar{c}$, $\bar{d}$).

FIG. 7 illustrates a circuit implementation which enables a shift in branch metrics in response to the phase shift signal in accordance with the above. In FIG. 7, each of the three-bit input branch metric values ($R_{00}$, $R_{01}$, $R_{11}$, and $R_{10}$) are provided to a respective input of three-bit multiplexers 70, 72, 74 and 76. Provided at another input of multiplexer 70 is the branch metric value $R_{01}$. Similarly, also provided at another input to multiplexer 72 is the branch metric value $R_{01}$, while the branch metric value $R_{11}$ is also provided as another input to multiplexer 74. Finally, the branch metric value $R_{10}$ is also provided as another input to multiplexer 76. Each of multiplexers 70, 72, 74 and 76 also receive at a selection input the phase shift signal. Multiplexers 70, 72, 74 and 76 normally respectively provide an output of the input branch metric values $R_{00}$, $R_{01}$, $R_{11}$, and $R_{10}$ provided at the one input thereof. However in response to the phase shift signal, each of multiplexers 70, 72, 74 and 76 provide the value provided at the other input thereof.

An example of the branch metric rotation is a follows. In 8-PSK modulation a rotation of 45° would cause a phase shift signal to be generated. The normal branch metrics provided to the Viterbi decoder in accordance with Table II for a signal at 46° are as follows: $R_{00}=4$; $R_{01}=0$; $R_{11}=4$ and $R_{10}=7$. For the signal in this example: m($\bar{c}$, $\bar{d}$)=m(0,0)=$R_{00}=4$; m(a,b)=m(0,1)=$R_{01}=0$; m(c,d)=m(1,1)=$R_{11}=4$; and m($\bar{a}$, $\bar{b}$)=m(1,0)=$R_{10}=7$.

Each of multiplexers 70, 72, 74 and 76 which would normally respectively provide an output of $\hat{R}_{00}=4$; $\hat{R}_{01}=0$; $\hat{R}_{11}=7$ and $\hat{R}_{10}=4$ in the absence of the phase shift signal. However, in response to the phase shift signal in this example, the branch metric values are rotated such that the value selected for m($\bar{c}$, $\bar{d}$) is set to the value corresponding to m(a, b); the value selected for m(a, b) is set to the value corresponding to m(c, d); the value selected for m(c, d) is set to the value corresponding to m($\bar{a}$, $\bar{b}$); and the value selected for m($\bar{a}$, $\bar{b}$)) is set to the value corresponding to m($\bar{c}$,$\bar{d}$). Therefore under the phase shift condition; $\hat{R}_{00}=7$; $\hat{R}_{01}=4$; $\hat{R}_{11}=0$; and $\hat{R}_{10}=4$. Multiplexers 70, 72, 74 and 76 therefore respectively provide an output of the values $\hat{R}_{00}=7$; $\hat{R}_{01}=4$; $\hat{R}_{11}=0$ and $\hat{R}_{10}=4$. As can be seen from Table II this particular output corresponds to the branch metrics for a signal received at 90°, a phase shift at which the Viterbi decoder is able to decode the symbol data.

It should be realized that the numerology presented herein is for purposes of example and that other numerologies may be readily conceived using the teaching of the present invention. It should further be understood that the present invention is also applicable to codes other than convolutional codes, such as transparent block codes. In this type of implementation the convolutional encoder would be replaced by a block encoder, and the Viterbi decoder would be replace with a block decoder. It should further be understood that the present invention is equally applicable to Quadrature Amplitude Modulation (QAM) as well as M-ary PSK modulation.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. An apparatus for decoding trellis coded data transmitted as a signal point of a set of signal points in a signal space coordinate system, comprising:

first decoder means for receiving first information relative to signal space coordinates of a received signal, and providing an output indicative of an estimate of a first data bit represented by said received signal;

encoder means for receiving and encoding said first data bit estimate according to a predetermined encoding format, and for providing an output of corresponding encoded data; and trellis output mapping means for receiving second information corresponding in signal space to a region defined between two consecutive signal points of said set of signal points containing said signal space coordinates of said received signal receiving said encoded data, determining from said second information and said encoded data an estimate of at least one additional data bit represented by said received signal.

2. The apparatus of claim 1 wherein said first decoder means comprises a Viterbi decoder having an input for receiving said first information and an output coupled to said encoder means.

3. The apparatus of claim 2 wherein said first information comprises branch metric data corresponding to said received signal phase.

4. The apparatus of claim 2 further comprising branch metric memory means for storing branch metric data corresponding to predetermined values of phase in said signal space, for receiving a signal phase value and responsive thereto for providing corresponding branch metric data as said first information to said Viterbi decoder.

5. The apparatus of claim 4 further comprising sector logic means for receiving said signal space coordinates, selecting a sector value in accordance with said signal space coordinates and providing said sector value as said second information.

6. The apparatus of claim 2 wherein said encoder means comprises a convolutional encoder having an input coupled to said Viterbi decoder output and an output coupled to said trellis output mapper.

7. The apparatus of claim 2 further comprising sector logic means for receiving said signal space coordinates, selecting a sector value in accordance with said signal space coordinates and providing said sector value as said second information.

8. The apparatus of claim 1 wherein said first decoder means is further for providing a normalization signal which when exceeds a predetermined value is an indication of one of a predetermined phase of said received signal, said decoder further comprising rotation means for receiving said normalization signal, for generating a shift signal when said normalization signal exceeds said predetermined value, and for modifying said first information corresponding to a predetermined shift in signal space coordinates of said received signal.

9. A method for decoding trellis coded data transmitted as a signal point of a set of signal points in a signal space coordinate system comprising the steps of:

receiving first information relative to signal space coordinates of a received trellis coded data signal;

generating in response to said first information an estimate of a first data bit represented by said trellis coded data signal;

encoding said first data bit estimate according to a predetermined encoding format to provide corresponding encoded data;

receiving a sector value corresponding in signal space to a region defined between two consecutive signal points of said set of signal points containing said signal space coordinates of said received signal; and determining from said sector value and said encoded data an estimate of at least one additional data bit represented by said trellis coded data signal.

10. The method of claim 9 further comprising the steps of:

detecting when said trellis coded data signal is of one of a predetermined phase in said signal space;

generating a shift signal when said trellis coded data signal is of a detected one of said predetermined phases; and modifying said first information corresponding to a predetermined shift in signal space coordinates of said trellis coded data signal.

11. The method of claim 10 further comprising the step of modifying said sector value in response to said shift signal.

12. An apparatus for decoding trellis coded data transmitted as a signal point of a set of signal points in a signal space coordinate system comprising:

a branch metric memory for storing branch metric data corresponding to predetermined values of phase in said signal space, and having an input for receiving said transmitted signal point and responsive thereto for providing at an output corresponding branch metric data as first information;

a Viterbi decoder having an input coupled to said branch metric memory output for receiving said first information and having an output for providing an estimate of a first data bit represented by said received signal;

an encoder having an input coupled to said Viterbi decoder output for encoding said first data bit estimate according to a predetermined encoding format and having an output for providing corresponding encoded data;

a sector logic element having an input for receiving said signal space coordinates, said sector logic element for selecting a sector value corresponding in signal space to a region defined between two consecutive signal points of said set of signal points containing said signal space coordinates of said received signal and having an output to provide said sector value; and a trellis output mapper having a first input for receiving said sector value and a second input for receiving said encoded data, and for determining from said sector value and said encoded data an estimate of at least one additional data bit represented by said received signal and having an output for providing said estimate.

13. The apparatus of claim 12 wherein said encoder means comprises a convolutional encoder having an input coupled to said Viterbi decoder output and an output coupled to said trellis output mapper.

14. The apparatus of claim 13 wherein said first decoder means is further for providing a normalization signal at an additional output which when exceeds a predetermined value is an indication of one of a predetermined phase of said received signal, said decoder further comprising rotation means for receiving said normalization signal, for generating a shift signal when said normalization signal exceeds said predetermined value, and for modifying said first information corresponding to a predetermined shift in signal space coordinates of said received signal.

15. The apparatus of claim 12 further comprising a sector value memory means for storing sector value data corresponding to predetermined phase in signal space.

16. An apparatus for decoding trellis coded data comprising:

Viterbi decoder means for receiving first information relative to signal space coordinates of a received signal, and providing an output indicative of an estimate of a first data bit represented by said received signal;

convolutional encoder means for receiving and convolutionally encoding said first data bit estimate according to a predetermined encoding format, and for providing an output of corresponding encoded data; and trellis output mapping means for receiving second information corresponding to a sector of signal space provided in accordance with a predetermined signal space sectorization format, receiving said encoded data, determining from said second information and said encoded data an estimate of at least one additional data bit represented by said received signal.

17. The apparatus of claim 16 further comprising a differential decoder means for receiving said estimate of at least one additional data bit represented by said received signal and decoding said estimate according to a predetermined decoding format.

18. The apparatus of claim 16 wherein said Viterbi decoder is further for providing a normalization signal which when exceeds a predetermined value is an indication of one of a predetermined phase of said received signal.

19. The apparatus of claim 18 further comprising means for modifying said first information responsive to said normalization signal exceeding said predetermined value.

20. The apparatus of claim 18 further comprising sector rotation logic means for shifting said second information by a predetermined shift format responsive to said normalization signal exceeding said predetermined value.

21. A circuit for decoding trellis coded data transmitted as a signal point of a set of signal points in a signal space coordinate system, comprising:
   branch metric memory circuit for storing branch metric data corresponding to predetermined values of phase in said signal space, and having an input for receiving said signal phase value and responsive thereto for providing at an output corresponding branch metric data as first information;
   a first decoding circuit for receiving said first information, and providing an output indicative of an estimate of a first data bit represented by said received signal;
   an encoder circuit for receiving and encoding said first data bit estimate according to a predetermined encoding format, and for providing an output of corresponding encoded data;
   a sector logic circuit for receiving said signal space coordinates and selecting a sector value corresponding in signal space to a region defined between two consecutive signal points of said set of signal points containing said signal space coordinates of said received signal; and
   a trellis output mapping circuit for receiving said sector value and said encoded data, determining from said sector value and said encoded data an estimate of at least one additional data bit represented by said received signal.

22. The circuit of claim 21 wherein said first decoding circuit comprises a Viterbi decoder having an input for receiving said first information and an output coupled to said encoder means.

23. The circuit of claim 22 wherein said encoder circuit comprises a convolutional encoder having an input coupled to said Viterbi decoder output and an output coupled to said trellis output mapper.

24. The apparatus of claim 21 wherein said first decoder circuit is further for providing a normalization signal which when exceeds a predetermined value is an indication of one of a predetermined phase of said received signal, said decoder further comprising rotation means for receiving said normalization signal, for generating a shift signal when said normalization signal exceeds said predetermined value, and for modifying said first information corresponding to a predetermined shift in signal space coordinates of said received signal.

* * * * *